(12) United States Patent
Goebel et al.

(10) Patent No.: US 8,625,247 B2
(45) Date of Patent: Jan. 7, 2014

(54) PROTECTIVE CIRCUIT FOR THE INPUT-SIDE PROTECTION OF AN ELECTRONIC DEVICE OPERATING IN THE MAXIMUM FREQUENCY RANGE

(75) Inventors: Uhland Goebel, Senden (DE); Mischa Graeni, Volketswil (CH); Gregor Kuehne, St. Gallen (CH); Beat Herrmann, Herisau (CH); Holger Karstensen, Volketswil (CH); Frank Felbier, Uster (CH)

(73) Assignee: Huber + Suhner AG (CH)

( * ) Notice: Subject to any disclaimer, the term of this patent is extended or adjusted under 35 U.S.C. 154(b) by 880 days.

(21) Appl. No.: 12/681,705

(22) PCT Filed: Oct. 3, 2007

(86) PCT No.: PCT/EP2007/008583
§ 371 (c)(1),
(2), (4) Date: Jun. 11, 2010

(87) PCT Pub. No.: WO2009/043364
PCT Pub. Date: Apr. 9, 2009

(65) Prior Publication Data
US 2010/0296214 A1 Nov. 25, 2010

(51) Int. Cl.
*H02H 3/22* (2006.01)
(52) U.S. Cl.
USPC .......................................................... 361/119
(58) Field of Classification Search
USPC .......................................................... 361/119
See application file for complete search history.

(56) References Cited

U.S. PATENT DOCUMENTS

| | | | |
|---|---|---|---|
| 4,262,317 A * | 4/1981 | Baumbach | 361/124 |
| 4,463,406 A | 7/1984 | Sirel | |
| 4,554,608 A * | 11/1985 | Block | 361/119 |
| 5,027,100 A * | 6/1991 | Neuwirth et al. | 337/32 |
| 5,345,199 A | 9/1994 | Glenn, Sr. et al. | |
| 5,768,084 A * | 6/1998 | Chaudhry et al. | 361/120 |
| 6,327,129 B1 * | 12/2001 | Oertel et al. | 361/118 |
| 2006/0293020 A1 | 12/2006 | Hash et al. | |
| 2010/0296214 A1* | 11/2010 | Goebel et al. | 361/56 |

FOREIGN PATENT DOCUMENTS

| | | |
|---|---|---|
| CH | 654 149 A5 | 1/1986 |
| DE | 34 25 296 A1 | 1/1986 |
| DE | 36 26 800 A1 | 2/1988 |

(Continued)

OTHER PUBLICATIONS

International Search Report dated Jun. 6, 2008, issued in corresponding international application No. PCT/EP2007/008583.

*Primary Examiner* — Ronald W Leja
(74) *Attorney, Agent, or Firm* — Ostrolenk Faber LLP

(57) ABSTRACT

The invention relates to a protective circuit (10) for the input-side protection of an electronic device (30) operating in the maximum frequency range from high-power interfering impulses in the working frequency range of the device (30), said protective circuit (10) between an input (11) and an output (18) comprising a first limiting circuit (12) having at least one gas discharge tube (GDT1, GDT2) for limiting high interference powers and a second limiting circuit (14, 16) disposed behind the first limiting circuit (12), said second limiting circuit having semi-conductor components (D1, ... , D4) for limiting smaller interference powers. Protection from particularly high interference powers is achieved in that the first limiting circuit (12) comprises two gas discharge tubes (GDT1, GDT2) connected in parallel and preferably identical.

10 Claims, 7 Drawing Sheets

(56) References Cited

FOREIGN PATENT DOCUMENTS

| | | |
|---|---|---|
| DE | 37 38 260 A1 | 6/1989 |
| DE | 39 07 199 A1 | 9/1990 |
| EP | 0 855 758 A | 7/1998 |
| GB | 2089173 | 6/1982 |
| GB | 2161659 | 1/1986 |
| GB | 2 302 621 A | 1/1997 |
| WO | WO 2006/124104 A1 | 11/2006 |

* cited by examiner

US 8,625,247 B2

PROTECTIVE CIRCUIT FOR THE INPUT-SIDE PROTECTION OF AN ELECTRONIC DEVICE OPERATING IN THE MAXIMUM FREQUENCY RANGE

BACKGROUND

In wireless communication, in the case of radar installations or other receiving devices which operate at microwave frequencies, and whose input is normally coupled to an antenna, high-power interference pulses or frequency bursts, with steep rising flanks can deliberately or inadvertently be applied to the input of the appliance, whose frequencies fall in the operating frequency range of the appliance, where they temporarily or permanently affect the sensitive input stages or, furthermore, cause damage.

In the past, it has therefore variously been proposed that appliance inputs such as these be protected by means of protective circuits upstream of the input, which reliably limit or attenuate such fast high-power interference pulses without noticeably impeding the wanted signals being fed into the appliance input. In this case, a plurality of limiter circuits, which cover a coarse and a fine range of the interference power, are frequently connected in series, for example with gas discharge paths being used for the coarse range and limiting semiconductor components being used for the fine range.

By way of example, CH-A5-654 149 discloses a protective circuit against NEMPs, in which a gas cell as coarse protection means and a varistor as fine protection means are connected in series via a frequency-selective delay element.

DE-A1-34 25 296 discloses a protective apparatus for electronic appliances, in which a coarse protective device with a gas discharge path and a fine protective device which operates with semiconductor elements are accommodated in separate housings and are connected to one another via a relatively long connecting cable. DE A1-36 26 800 also discloses a comparable solution.

DE A1-39 07 199 discloses an overvoltage protective device for coaxial cables, in which a three-electrode suppressor is used for coarse protection, and a combination of switching diodes and limiter diodes is used for fine protection. The three-electrode suppressor is inserted into a printed circuit board on which the other circuit elements are also arranged. The end-face electrodes of the three-electrode suppressor are connected to the inner conductor and outer conductor of the coaxial cable, while the center electrode is connected to a separate ground line.

EP-A1-0 855 758 discloses a circuit arrangement for protection of RF input circuits of telecommunication appliances, in which a fine protective circuit having a varistor and a limiter diode is provided behind a gas capsule suppressor or a lambda/4 short-circuit line.

Finally, it has been known for a long time for PIN diodes to be used for limiting interference pulses at the input of appliances which operate in the microwave range, and these are distinguished by very small internal capacitances and short response times (see for example U.S. Pat. No. 5,345,199 or WO-A1-2006/124104).

Other protective methods relate to quick active regulation of a limiting element in the input of the appliance (US-A1-2006/0293020).

The known protective circuits and protective methods are not sufficient for reliably limiting or attenuating very high power interference pulses, for example those transmitted by pulsed radars or specific interference pulse generators.

SUMMARY

The object of the invention is to specify a protective circuit which avoids the disadvantages of known protective circuits and is distinguished by a simple, compact and robust design, as well as reliable limiting of fast and, in particular, high-power interference pulses in the microwave band.

The object is achieved by the totality of the features of claim 1. One essential feature for the invention is a limiter circuit, arranged at the input of the protective circuit, for the coarse power range, which comprises two parallel-connected gas discharge tubes which are connected in parallel in a specific manner. The two gas discharge tubes, which are preferably of the same type and are arranged one behind the other connected in parallel allow the isolation with respect to interference powers at the input to be improved by an order of magnitude (a factor of approximately 10) by very simple means and with a very compact design.

For optimum limiting, it is advantageous for the two gas discharge tubes to be coupled to one another as closely as possible, with regard to their ignition. According to one refinement of the invention, this is achieved in that the two gas discharge tubes have a common gas space.

It is particularly advantageous for the two gas discharge tubes to be physically combined in one gas capsule, which comprises a cylindrical gas space with two mutually opposite end-face electrodes and a center electrode which is arranged in the center between the two end-face electrodes, wherein the end-face electrodes each form one electrode of the two gas discharge tubes, and the center electrode forms the other electrode of the two gas discharge tubes. This makes it possible for one gas discharge tube to likewise be ignited comparatively quickly when the (adjacent) other gas discharge tube ignites, because of the plasma that is created in the gas space.

A bridging circuit which is in the form of a T-element with two inductances and one capacitance is preferably arranged between the end-face electrodes of the gas capsule, in order to pass on the wanted signals.

The coupling between two gas discharge tubes is improved further if the end-face electrodes extend so far in the axial direction into the gas space that their ends are covered by the center electrode, when seen in the radial direction. This results in the discharge paths of the two tube or electrode systems being directly adjacent, and influencing one another particularly intensively.

In order to ensure that the proximity of the two gas discharge tubes does not lead to undesirable electromagnetic coupling between the input and the output of the limiter circuit, means are preferably provided for electromagnetically decoupling the two gas discharge tubes.

In particular, for electromagnetic decoupling of the two gas discharge tubes, the gas capsule is installed with its cylinder axis essentially at right angles to the plane into an electrically conductive flat plate, such that the plate is located between the end-face electrodes of the gas capsule. The plate then has a shielding effect.

Another refinement of the invention is characterized in that PIN diodes are used as semiconductor components for limiting relatively low interference power levels, with the PIN diodes preferably being connected back-to-back in parallel, in pairs.

A further refinement of the invention is distinguished in that a third limiter circuit is arranged behind the second limiter circuit and likewise comprises semiconductor components, in that PIN diodes are in each case connected back-to-back in parallel, in pairs as semiconductor components in the second and the third limiter circuit, and in that the PIN diodes in the third limiter circuit have a lower power and respond more quickly than the PIN diodes in the second limiter circuit. The third limiter circuit reduces the response delay of the protective circuit even further. At the same time, the limiting range is extended toward lower power levels.

In order to achieve a compact design and good heat dissipation from the limiter elements, it is advantageous if the PIN diodes are arranged as unpackaged semiconductor chips directly on a thin ceramic substrate which is mounted flat on a cold plate for heat dissipation.

Another refinement of the invention is distinguished in that in order to ensure the response of the limiter circuits, a decoupling circuit is in each case arranged between the limiter circuits and between the last limiter circuit and the output, wherein, in particular, the decoupling circuit which is arranged between the first and the second limiter circuit comprises a series circuit formed from a capacitance and a transmission line, and the decoupling circuits in front of and behind the third limiter circuit each comprise a transmission line.

BRIEF DESCRIPTION OF THE DRAWINGS

The invention will be explained in more detail in the following text with reference to exemplary embodiments and in conjunction with the drawings, in which:

FIG. 9 shows an example of a diagram of power limiting by the protective circuit shown in FIG. 1a.

DETAILED DESCRIPTION

Figure 1:
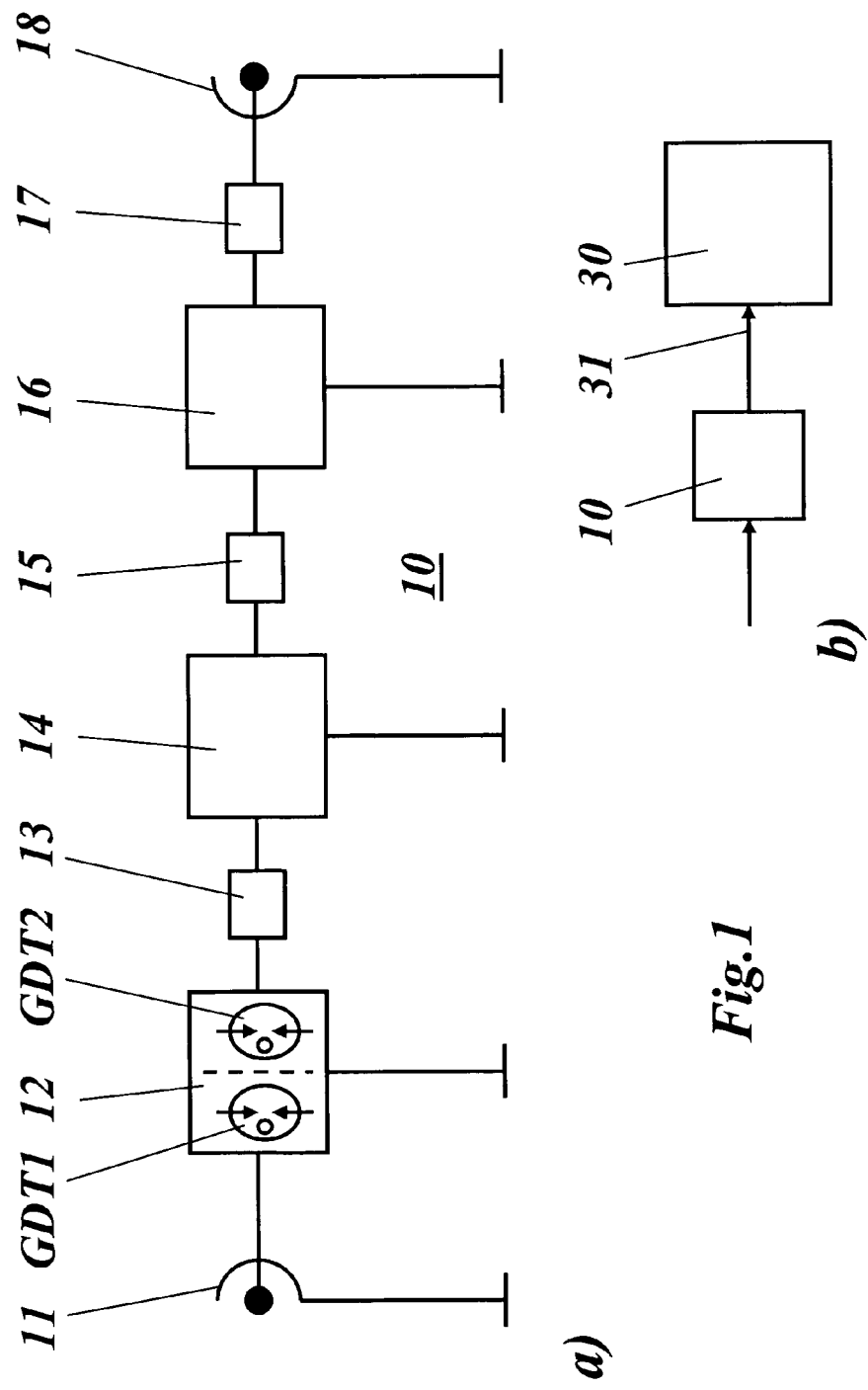
FIG. 1 uses two figure elements to show a block diagram of a protective circuit according to one exemplary embodiment of the invention (FIG. 1a), and the arrangement of the protective circuit from FIG. 1a in front of an appliance to be protected (FIG. 1b)

FIG. 1 uses two figure elements to show a block diagram of a protective circuit according to one exemplary embodiment of the invention (FIG. 1a) and the arrangement of the protective circuit from FIG. 1a in front of an appliance to be protected (FIG. 1b). The protective circuit 10 in the exemplary embodiment has an input 11 and an output 18, which may be in the form of coaxial plug connections. By way of example, the input 11 may be a Type N connector, and the output 18 a Type SMA. Plug connectors such as these for frequencies in the GHz range are available, for example, from the applicant.

Three limiter circuits 12, 14 and 16 are arranged in series between the input 11 and the output 18, and are connected to one another and to the output 18 by decoupling circuits 13, 15 and 17. The decoupling circuits 13, 15 and 17 ensure that, when the fastest reacting third limiter circuit is activated, sufficient voltage is dropped to then subsequently activate the second limiter circuit 14 and the first limiter circuit 12.

The power ranges and response times of the limiter circuits 12, 14 and 16 are graduated, with the first limiter circuit 12 having the highest power range and the slowest response time, while the third limiter circuit 16 is distinguished by the lowest power range and the fastest response time. The third limiter circuit 16 therefore extends the scope of protection of the appliance (30 in FIG. 1b) toward lower power levels and faster rising flanks, and therefore improves the effect of the protective circuit, irrespective of the actual configuration of the first limiter circuit 12. As shown in FIG. 1b, the protective circuit 10 is connected in front of the input 31 of the electronic appliance 30 to be protected, and therefore protects the appliance against overloading by fast and high-power interference pulses.

Figure 7:
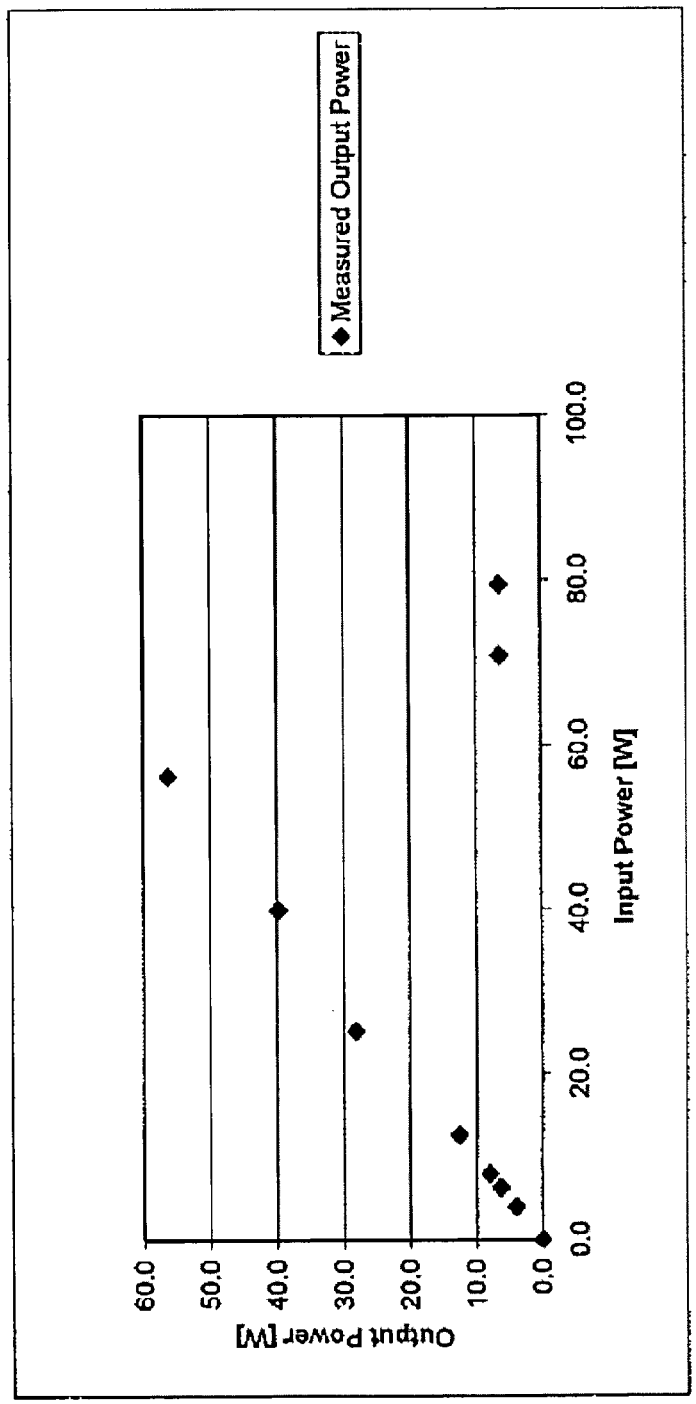
FIG. 7 shows an example of a diagram of power limiting by a gas discharge tube.

If just one simple typical gas discharge tube of the conventional type were to be used in the first limiter circuit 12, this would result in a relationship between the input power present at the input 11 and the output power that appears at the output 18, as is illustrated in the diagram in FIG. 7. The output power rises linearly with the input power with the gradient 1, until the gas discharge tube ignites at about 60 Watts, and limits the output power to less than 10 Watts. As the input power rises further, the output power then also continues to rise, as a result of which, at input power levels of several 1000 Watts, such as those which can occur in extreme cases, the protection of the appliance 30 is no longer ensured.

Figure 8:
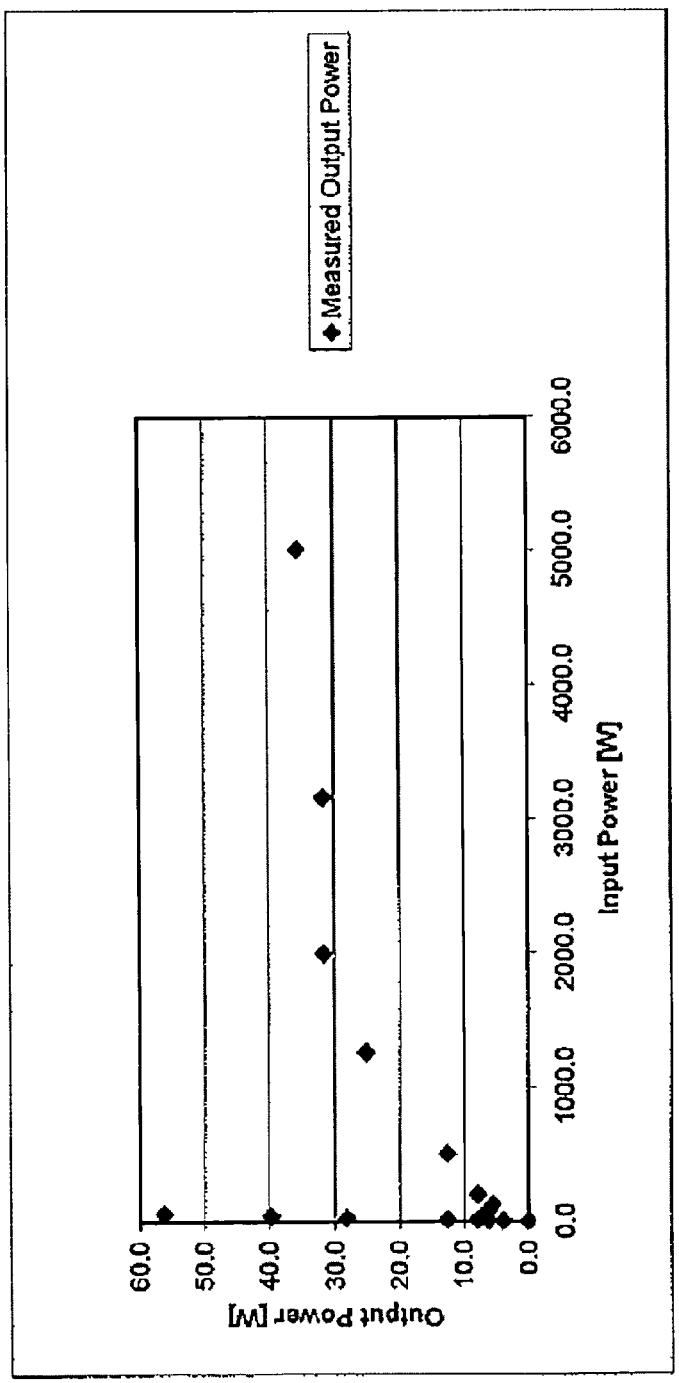
FIG. 8 shows an example of a diagram of power limiting by two gas discharge tubes arranged one behind the other in parallel.

It has now surprisingly been found that a simple parallel circuit of two gas discharge tubes (GDT1 and GDT2 in FIG. 1a) in the first limiter circuit 12 provides protection against 10-times higher input power levels, provided that the ignition responses of the two gas discharge tubes are sufficiently closely coupled to one another. This then results in a relationship between the input power and the output power as is shown in the diagram in FIG. 8, that is to say even input power levels of 3000 Watts and more are reliably limited to output power levels of about 30 Watts, before the output power rises again with the input power.

Figure 2:
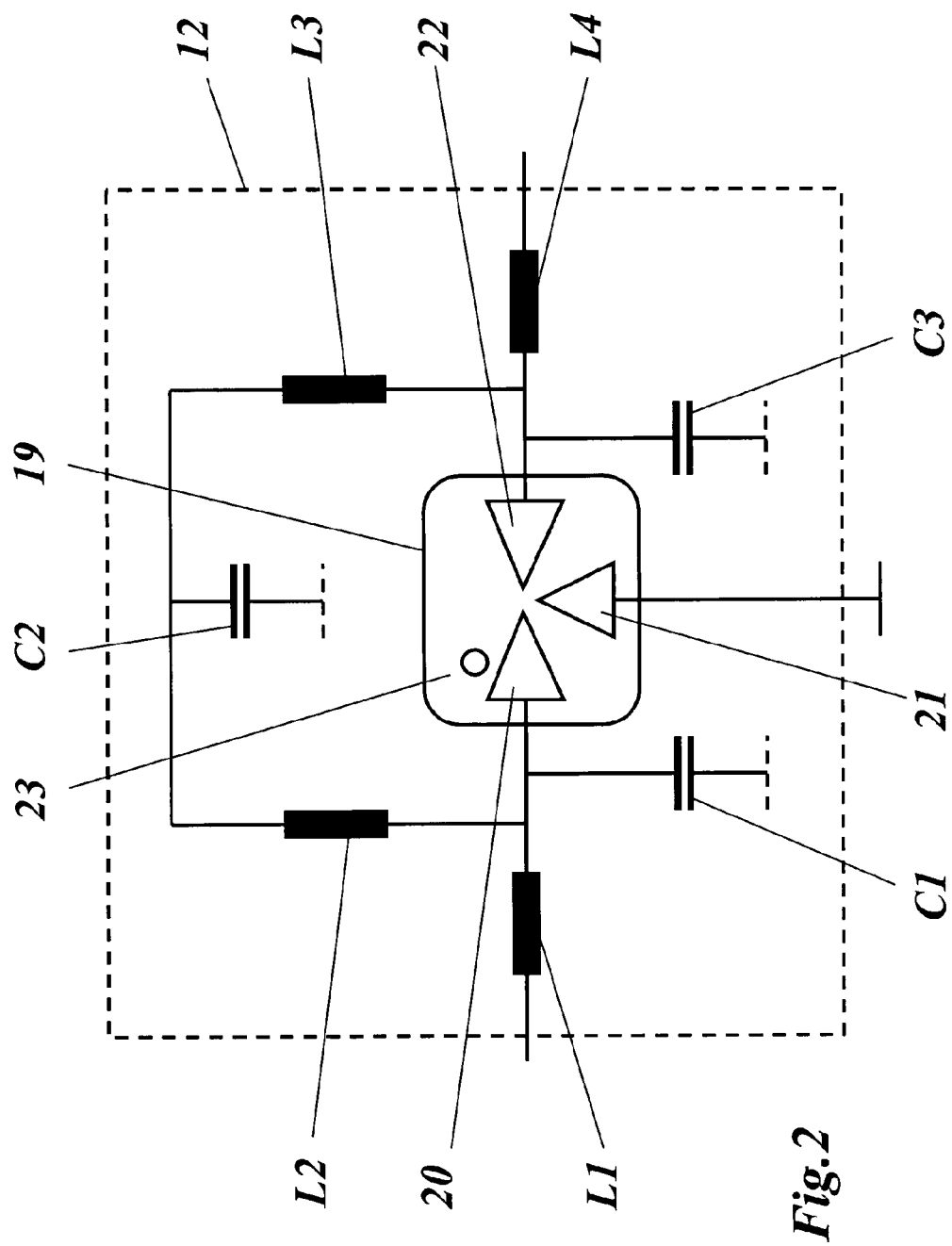
FIG. 2 shows the internal design of the first limiter circuit shown in FIG. 1a, with a gas capsule with a center electrode as a limiting element.
Figure 5:
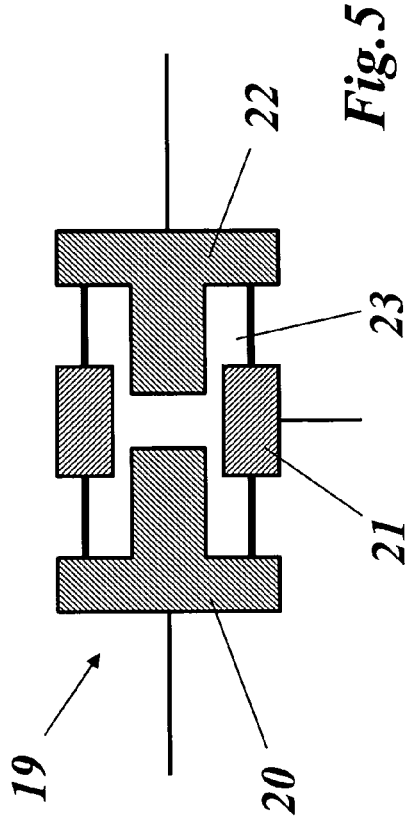
FIG. 5 shows the internal design of a preferred gas capsule with end electrodes which extend into the area of the center electrode.

In order to achieve close coupling in a simple manner between the two gas discharge tubes (GDT) arranged one behind the other in parallel, a ceramic three-electrode gas discharge tube (gas capsule 19) is used as shown in FIG. 2 and FIG. 5, and is connected such that the two end-face electrodes 20, 22 respectively form one electrode of the two gas discharge tubes GDT1, GDT2, and the center electrode 21 forms the other electrode of the two gas discharge tubes GDT1, GDT2. The type of gas capsule 19 illustrated in FIG. 5 is preferably used in this case, in which the end-face electrodes 20 and 22 project so far into the interior of the gas space 23 in the axial direction that they are covered by the (annular) center electrode 21 in the radial direction at the ends. This results in very close coupling between the discharge paths of the electrode pairs 20, 21 and 22, 23, and this leads to the ignition of the rear gas discharge tube GDT2 being triggered by the already ignited first gas discharge tube GDT1, and in this being done with only a short time delay.

As can be seen in FIG. 2, the three-electrode gas capsule 19 is installed in the protective circuit 10 such that the path which is formed between the two end-face electrodes 20, 22 interrupts the inner conductor of the protective circuit 10, while the center electrode 21 is grounded. In order to bridge the interruption, a bridging circuit is arranged between the end-face electrodes 20 and 22, in the form of a T-element with two inductances L2 and L3 and a capacitance C2. Furthermore, the capacitances C1 and C3 of the discharge paths of the gas capsule 19 as well as the inductances L1 and L4 of the supply lines to the end-face electrodes 20 and 22 play a part in terms of radio-frequency technology.

Figures 3, 4:
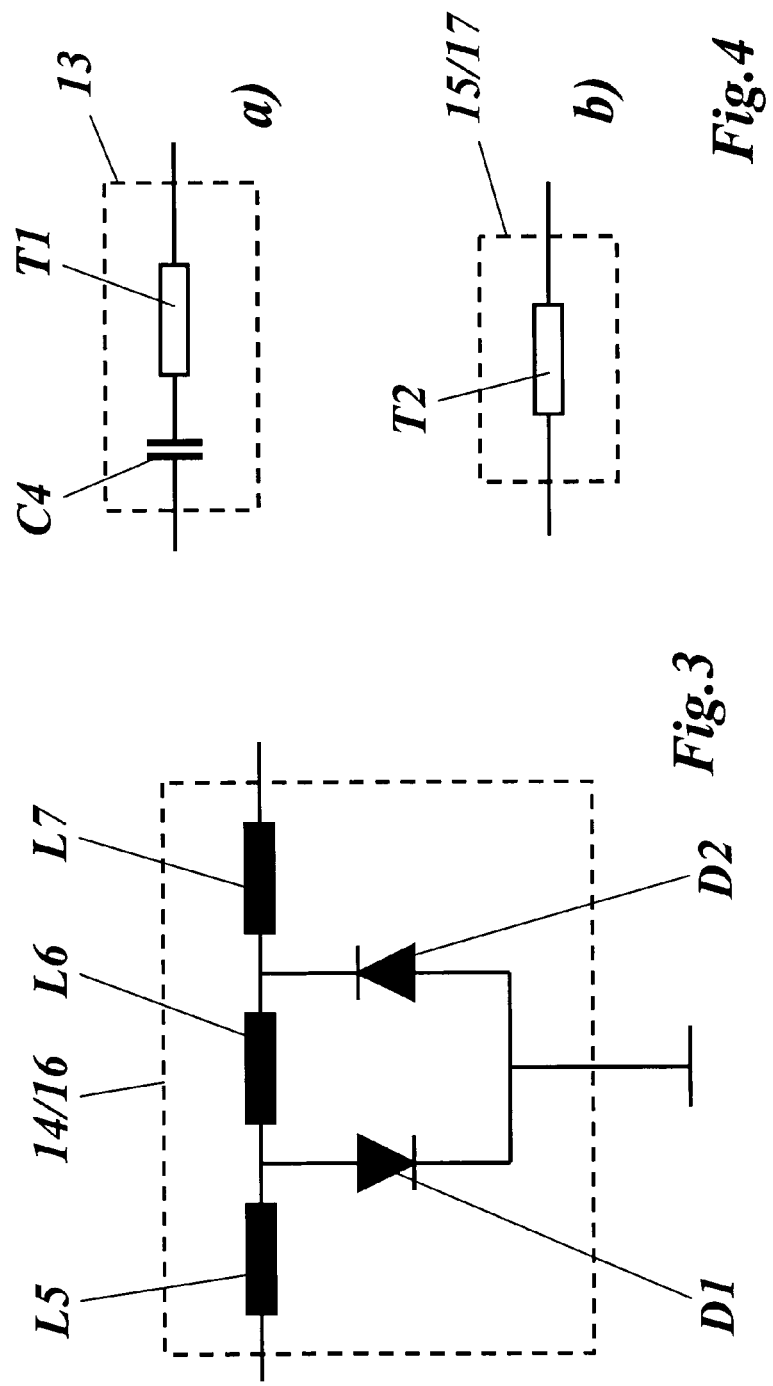
FIG. 3 shows the circuit of the two other limiter circuits from FIG. 1a, in each case with a pair of PIN diodes, connected back-to-back in parallel, as limiting elements.
FIG. 4 uses two figure elements to show the design of the decoupling circuit between the first two limiter circuits (FIG. 4a) and the decoupling circuits in front of and behind the third limiter circuit (FIG. 4b)

The second limiter circuit 14 and the third limiter circuit 16 are designed as shown in FIG. 3: two PIN diodes D1, D2 (and D3, D4 in FIG. 6) of the same type are connected back-to-back in parallel in them. By way of example, glass-passivated chips from the Tyco Company or M/A-Com can be used as PIN diodes. In this case, the inductances L5, L6 and L7 of the supply lines are also important for radio-frequency purposes, and these are governed by the bonding wires 27, which can be seen in FIG. 6, of the PIN diode chips. The decoupling circuits 13, 15 and 17 which are provided between the limiter circuits 12, 14 and 16 and after the limiter circuit 16 are internally designed as shown in FIGS. 4a and b: the limiter circuit 13 comprises a series circuit of a capacitance C4 and a transmission line T1, and the limiter circuits 15 and 17 each contain a transmission line T2.

Figure 6:
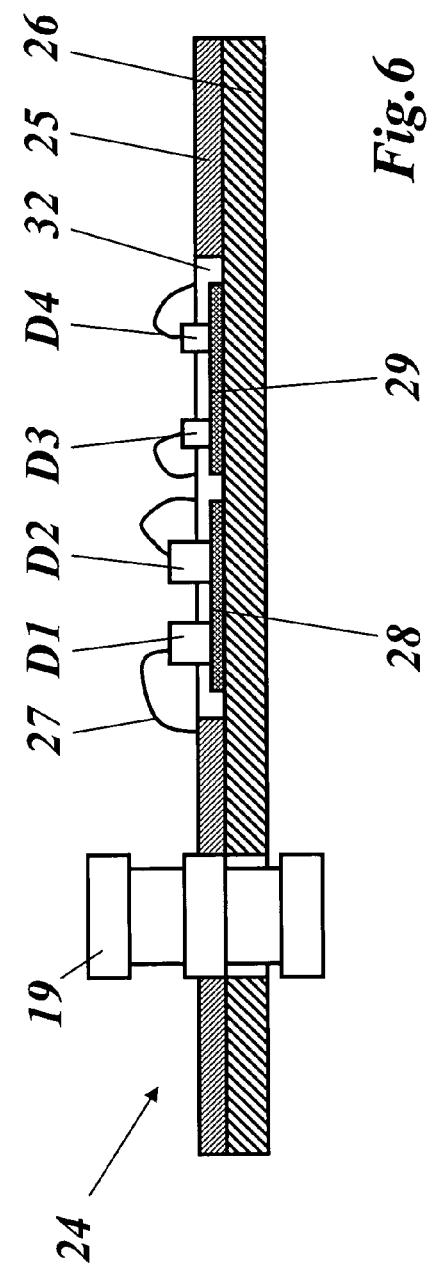
FIG. 6 shows a preferred circuit design for the protective circuit shown in FIGS. 1 to 4.

Since the protective circuit 10 must be designed for the GHz range and must process considerable power levels in the event of interference, the design of the limiter circuits 12, 14 and 16 is of considerable importance. FIG. 6 shows one exemplary embodiment of an appropriate circuit design 24, in a simplified form. The circuit design comprises a preferably metallic cold plate 26 with good thermal conductivity and a high heat capacity, which can absorb and dissipate the heat that is created. A printed circuit board 25 is arranged on the upper face of the cold plate 26, and is used for wiring of the circuit. The printed circuit board 25 has a cutout 32 which leaves free part of the area of the surface of the cold plate 26. Thin, electrically insulating ceramic substrates 28, 29 are arranged in the cutout 32, closely thermally coupled to the cold plate 26, and the PIN diode pairs D1, D2 and D3, D4 of the limiter circuits 14 and 16 are accommodated on their surface, in the form of unpackaged semiconductor chips. The size relationships of the chips shown in FIG. 6 have in this case been illustrated in an exaggerated form, in order to improve clarity. The PIN diodes D1, . . . , D4 are adhesively bonded or soldered on the lower face to the ceramic substrates 28, 29. The bonding pads on the upper faces are connected by means of bonding wires 27 to corresponding conductor tracks on the printed circuit board 25.

A particular type of installation is envisaged for the gas capsule 19: corresponding openings are left free one above the other in the cold plate 26 and in the printed circuit board 25, through which the cylindrical gas capsule 19 can be passed, with its cylinder axis at right angles to the plane of the plate. In this case, the center electrode is located at approximately the same height as the printed circuit board 25 and can be grounded via a very short path. In this configuration, the metallic cold plate 26 represents a shield, which reduces or entirely suppresses the electromagnetic coupling between the electrode paths 20, 21 and 22, 21, thus suppressing undesirable crosstalk from the input to the output of the gas capsule 19.

Figure 9:
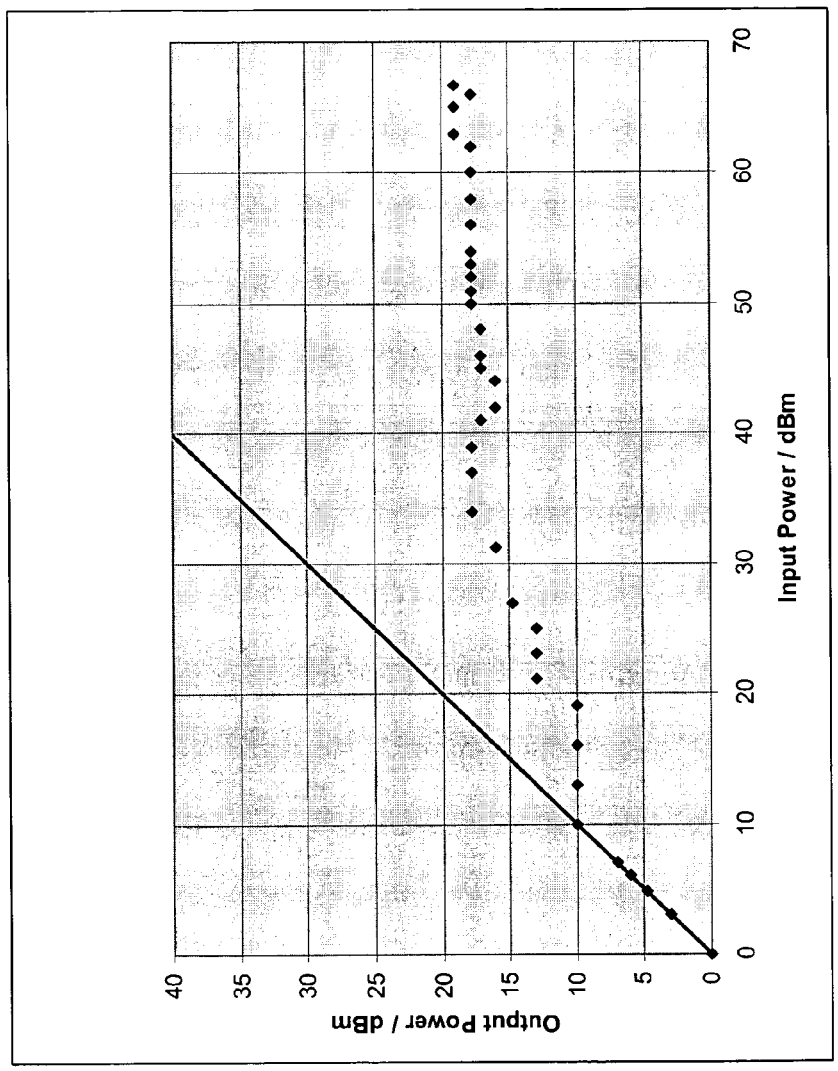

The protective circuit 10 as shown in FIGS. 1 to 6 results in a considerably extended protective effect for the appliance 30, as is illustrated by the diagram shown in FIG. 9, which shows the relationship between the input power level and the output power level (in decibels with respect to 1 mW) plotted on a double-logarithmic scale.

REFERENCE SYMBOLS

10 Protective circuit
11 Input
12, 14, 16 Limiter circuit
13, 15, 17 Decoupling circuit
18 Output
19 Gas capsule
20, . . . , 22 Electrode (gas capsule)
23 gas space
24 Circuit layout
25 Printed circuit board
26 Cold plate
27 Bonding wire
28, 29 Ceramic substrate
30 Electronic appliance
31 Input
32 Cutout
C1, . . . , C4 Capacitance
D1, . . . , D4 PIN diode
GDT1, GDT2 Gas discharge tube
L1, . . . , L7 Inductance
T1, T2 Transmission line

The invention claimed is:

1. A protective circuit for input-side protection of an electronic appliance which operates in the microwave range against high-power interference pulses in the operating frequency range of the appliance, which protective circuit comprises, between an input and an output, a first limiter circuit with at least one gas discharge tube for limiting high interference power levels and a second limiter circuit, arranged behind the first limiter circuit, with semiconductor components for limiting lower interference power levels,
  wherein the first limiter circuit comprises two gas discharge tubes, connected in parallel, the two gas discharge tubes have a common gas space, the two gas discharge tubes are physically combined in one gas capsule, which comprises a cylindrical gas space with two mutually opposite end-face electrodes and a center electrode which is arranged in the center between the two end-face electrodes, wherein the end-face electrodes each form a respective electrode of one of the two gas discharge tubes, and the center electrode forms the other electrode of both of the two gas discharge tubes, and
  an electrically conductive flat plate is provided for electromagnetically decoupling the two gas discharge tubes from each other, the cylindrical gas capsule being inserted into said plate with its longitudinal axis at right angles to said plate and the two end-face electrodes on opposite sides of said plate, the plate thereby forming an electromagnetic shield between the end-face electrodes of the gas capsule.

2. The protective circuit as claimed in claim 1, characterized in that the end-face electrodes extend so far in the axial direction into the gas space that their ends are covered by the center electrode when seen in the radial direction.

3. The protective circuit as claimed in claim 1, characterized in that PIN diodes are used as the semiconductor components for limiting relatively low interference power levels.

4. The protective circuit as claimed in claim 3, characterized in that the PIN diodes are connected back-to-back in parallel, in pairs.

5. The protective circuit as claimed in claim 1, characterized in that a third limiter circuit is arranged behind the second limiter circuit and likewise comprises semiconductor components, in that PIN diodes are in each case connected back-to-back in parallel, in pairs as semiconductor components in the second and the third limiter circuit, and in that the PIN diodes in the third limiter circuit have a lower power and respond more quickly than the PIN diodes in the second limiter circuit.

6. The protective circuit as claimed in claim 5, characterized in that the PIN diodes are arranged as unpackaged semiconductor chips directly on a thin ceramic substrate which is mounted flat on a cold plate for heat dissipation.

7. The protective circuit as claimed in claim 1, characterized in that, in order to ensure the response of the limiter circuits, a decoupling circuit is in each case arranged between the limiter circuits and between the last limiter circuit and the output.

8. The protective circuit as claimed in claim 7, characterized in that the decoupling circuit which is arranged between the first and the second limiter circuit comprises a series circuit formed from a capacitance and a transmission line, and in that the decoupling circuits in front of and behind a third limiter circuit each comprise a transmission line.

9. The protective circuit as claimed in claim 1, characterized in that a bridging circuit is arranged between the end-face electrodes of the gas capsule.

10. The protective circuit as claimed in claim 9, characterized in that the bridging circuit is in the form of a T-element with two inductances and one capacitance.

* * * * *

UNITED STATES PATENT AND TRADEMARK OFFICE
CERTIFICATE OF CORRECTION

PATENT NO.        : 8,625,247 B2                                        Page 1 of 1
APPLICATION NO. : 12/681705
DATED             : January 7, 2014
INVENTOR(S)       : Goebel et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 948 days.

Signed and Sealed this
Twenty-second Day of September, 2015

Michelle K. Lee
*Director of the United States Patent and Trademark Office*